US009661970B2

(12) United States Patent
Jeong

(10) Patent No.: US 9,661,970 B2
(45) Date of Patent: May 30, 2017

(54) PRESSURE SWITCH FOR DUST SENSOR AND VACUUM CLEANER HAVING THE SAME

(71) Applicant: Samsung Electronics Co., Ltd., Suwon-si (KR)

(72) Inventor: Kyung-han Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/883,081

(22) Filed: Oct. 14, 2015

(65) Prior Publication Data

US 2016/0100732 A1 Apr. 14, 2016

(30) Foreign Application Priority Data

Oct. 14, 2014 (KR) .......................... 10-2014-0138081

(51) Int. Cl.
| | |
|---|---|
| *A47L 9/28* | (2006.01) |
| *F16K 17/00* | (2006.01) |
| *G01L 1/00* | (2006.01) |
| *H03K 17/94* | (2006.01) |

(52) U.S. Cl.
CPC .............. *A47L 9/2821* (2013.01); *G01L 1/00* (2013.01); *H03K 17/94* (2013.01)

(58) Field of Classification Search
CPC .... A47L 9/2821; A47L 9/2842; A47L 9/2857; A47L 2201/00; G01L 11/00
See application file for complete search history.

(56) References Cited

U.S. PATENT DOCUMENTS

| | | | | |
|---|---|---|---|---|
| 5,301,385 A | * | 4/1994 | Abe ...................... | A47L 9/2826 15/319 |
| 5,881,430 A | * | 3/1999 | Driessen ............... | A47L 9/2821 15/319 |
| 2005/0097701 A1 | * | 5/2005 | Kushida ................ | A47L 9/2821 15/319 |
| 2005/0223515 A1 | * | 10/2005 | Kiern ....................... | A47L 9/19 15/339 |

FOREIGN PATENT DOCUMENTS

| | | |
|---|---|---|
| EP | 2 208 454 B1 | 7/2012 |
| KR | 10-1998-0059054 | 10/1998 |
| KR | 10-1999-0009016 | 5/1999 |
| KR | 20-0280966 Y1 | 7/2002 |
| KR | 10-2010-0084884 | 7/2010 |

* cited by examiner

*Primary Examiner* — Dung Van Nguyen
(74) *Attorney, Agent, or Firm* — McAndrews, Held & Malloy, Ltd.

(57) ABSTRACT

A pressure switch configured to be disposed on a path, through which dust passes, to control a dust sensor according to whether a suction pressure is formed in the path, is provided. The pressure switch includes: a body part having a connection tube connected to the path, and an upper surface; first and second terminals configured to be electrically connected to the dust sensor, and at least a portion of which protrudes from the upper surface of the body part; and a flexible cap configured to engage the body part to define a space along with the upper surface of the body part. The flexible cap is deformed in response to a negative pressure being formed in the space, thereby electrically connecting the first and second terminals.

19 Claims, 17 Drawing Sheets

PRESSURE SWITCH FOR DUST SENSOR AND VACUUM CLEANER HAVING THE SAME

CROSS-REFERENCE TO RELATED APPLICATION(S)

This application claims priority under 35 U.S.C. §119 from Korean Patent Application No. 10-2014-0138081, filed on Oct. 14, 2014, in the Korean Intellectual Property Office, the disclosure of which is incorporated herein by reference in its entirety.

BACKGROUND

1. Field

The present general inventive concept generally relates to providing a pressure switch for a dust sensor applied to a vacuum cleaner, and more particularly, to providing a pressure switch for turning on and/or off a dust sensor that is installed on a suction path to sense dust flowing into a vacuum cleaner.

2. Description of the Related Art

In general, a pressure switch for a dust sensor applied to a vacuum cleaner senses a pressure change in one place of an extension tube to turn on and/or off the dust sensor according to the pressure change.

A pressure switch as described above includes a body part and a rubber cap that is combined with an upper part of the body part. In this case, a preset space part or space is formed inside the rubber cap. The preset space is connected to the extension tube and thus shrinks due to a negative pressure formed when a suction pressure acts in the extension tube.

A coil spring is disposed in the preset space part, and a copper plate is disposed on an internal surface of the rubber cap so as to enable an upper end of the coil spring to be electrically connected to the copper plate. In this case, a lower end of the coil spring is electrically connected to a first terminal of the dust sensor. Also, a second terminal is combined with the body part to be disposed in the preset space part and is electrically connected to the dust sensor.

Since the coil spring simultaneously elastically supports an upper surface of the body part and the internal surface of the rubber cap, the copper plate disposed inside the rubber cap and the second terminal are separated from each other. If the negative pressure is formed in the preset space part in this state, the rubber cap shrinks so as to connect the copper plate to the second terminal and to activate the dust sensor. On the contrary, if the negative pressure is released from the preset space part, the rubber cap returns to an original shape thereof due to an elastic force of the coil spring. Therefore, the copper plate is disconnected from the second terminal, and thus deactivating or turning off the dust sensor.

In the pressure switch, the first terminal, the coil spring, the copper plate, and the second terminal may be sequentially powered or electrified to activate the dust sensor. However, the pressure switch has various failure factors at connection points between the first terminal and the coil spring, between the coil spring and the copper plate, and between the copper plate and the second terminal. For example, errors may occur in connection and disconnection operations between the first and second terminals due to various failure factors such as a connection failure or a removal of the coil spring caused by corrosion, a non-return to an original shape of the coil spring caused by twisting of the coil spring occurring when the coil spring is compressed and then expanded to an original shape thereof, a decrease in the elastic force of the coil spring caused by a long period usage, or the like.

Also, the pressure switch for the dust sensor needs an additional cable and an additional connector because of a complicated terminal structure as described above. Therefore, unit prices of products increase, and an assembling property is poor.

SUMMARY

Exemplary embodiments address at least the above problems and/or disadvantages and other disadvantages not described above. Also, the exemplary embodiments are not required to overcome the disadvantages described above, and an exemplary embodiment may not overcome any of the problems described above.

The exemplary embodiments provide a pressure switch that is used for a dust sensor, minimizes a connection point between first and second terminals to remarkably reduce connection and disconnection failure factors, use a simple structure to be easily assembled, and reduce unit prices of products.

According to an aspect of the exemplary embodiments, there is provided a pressure switch configured to be disposed on a path through which dust passes, to control a dust sensor according to whether a suction pressure is formed in the path, the pressure switch including: a body part having a connection tube connected to the path, and an upper surface; first and second terminals configured to be electrically connected to the dust sensor and include upper ends protruding from the upper surface of the body part; and a flexible cap configured to engage the body part and define a space with the upper surface of the body part. The flexible cap may be deformed in response to a negative pressure being formed in the space to electrically connect the first terminal and the second terminal.

The flexible cap may include a conductive member that is disposed inside the flexible cap to be connectable with the first and second terminals.

The flexible cap may engage the body part along with the conductive member therein.

The flexible cap may be formed of an elastic body.

A flow path groove may be formed in an upper surface of the body part to be connected to the connection tube.

The flow path groove may be disposed between the first and second terminals.

A height of the first terminal that protrudes from the upper surface of the body part is different than a height of the second terminal that protrudes from the upper surface of the body part.

A position of the second terminal may be set to correspond to a position where a deformation amount of the flexible cap is at or near the greatest. Here, the greatest deformation amount of the flexible cap may be a greatest deformation amount which can be modified by the negative pressure.

The first terminal may be set in a position where the first terminal is eccentric from a center of the flexible cap, and the second terminal may be set in a position corresponding to the center of the flexible cap.

The first and second terminals may be separated from the conductive member in response to the space being in an air pressure state.

The first terminal may be connected to the conductive member at all times, and the second terminal may be connected to the conductive member in response to the space being in a negative pressure state.

The body part may include first and second extension parts that protrude from a lower part of the body part to support the first and second terminals. The first and second terminals may be respectively inserted into the first and second extension parts and include lower ends that protrude beyond the first and second extension parts.

Upper parts and lower parts of the first and second terminals may be respectively fixed to first and second hooking projections that are respectively formed at the first and second extension parts.

The body part may further include a support part that protrudes from a lower part thereof. Lower ends of the first and second terminals and the support part may be all positioned on a level.

The first and second terminals may be formed in plate shapes and may be disposed at a distance from each other to be parallel with each other.

A separation projection may protrude from an internal surface of the flexible cap. A length of the separation projection may be greater than a thickness of the conductive member measured from the internal surface of the flexible cap.

The separation projection may be disposed adjacent to the conductive member.

A lower end of the separation projection may be elastically supported on the upper surface of the body part.

According to another aspect of the exemplary embodiments, there is provided a pressure switch configured to be disposed on a path through which dust passes, to control a dust sensor according to whether a suction pressure is formed in the path, the pressure switch including: a body part has a connection tube connected to the path, and includes an upper surface in which a flow groove is formed to be connected to the connection tube; first and second terminals configured to be electrically connected to the dust sensor and have respective ends that protrude from the upper surface of the body part, the respective ends have different heights when measured from the upper surface; and a flexible cap configured to engage the body part to define a space with the upper surface of the body part, and includes a conductive member therein to be electively connected to the first and second terminals. The conductive member may be connected to the first and second terminals in response to the flexible cap being deformed when a negative pressure is formed in the space.

According to another aspect of the exemplary embodiments, there is provided a vacuum cleaner including: a cleaner body including a suction source; a suction nozzle configured to suck or draw dust; an extension tube configured to connect the cleaner body to the suction nozzle; and a pressure switch disposed at the extension part to control a dust sensor according to whether a suction pressure is formed in the extension tube. The pressure switch may include:

a body part may have a connection part connected to the extension tube; first and second terminals configured to be electrically connected to the dust sensor and include upper ends that protrude to different heights from the upper surface of the body part; a flexible cap configured to engage the body part to define a space with the upper surface of the body part and include a conductive member therein to be connectable to the first and second terminals. The flexible cap may shrink in response to a negative pressure being formed in the space, thereby connecting the conductive member to the first and second terminals.

BRIEF DESCRIPTION OF THE DRAWINGS

The above and/or other aspects will be more apparent by describing certain exemplary embodiments with reference to the accompanying drawings, in which.

DETAILED DESCRIPTION OF THE EXEMPLARY EMBODIMENTS

Figure 1:
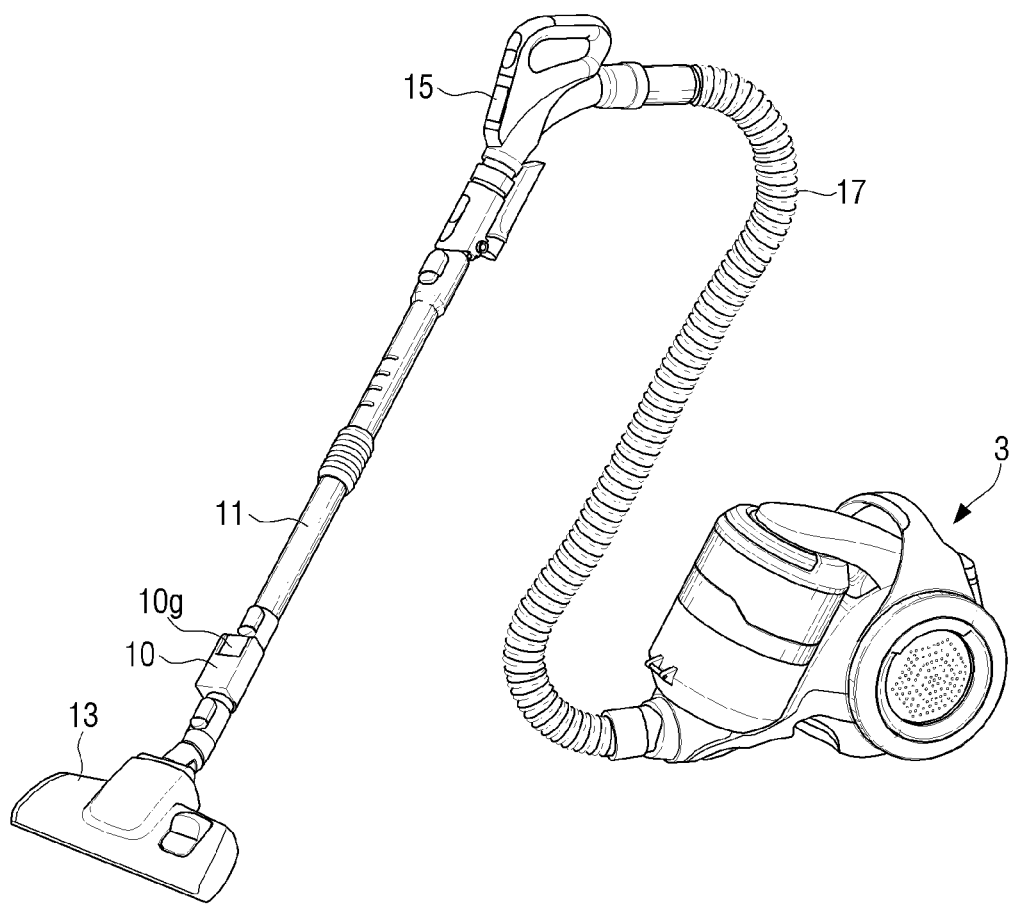
FIG. 1 is a perspective view illustrating a vacuum cleaner to which a pressure switch for a dust sensor is applied, according to an exemplary embodiment of the present general inventive concept.

Exemplary embodiments are described in greater detail with reference to the accompanying drawings.

In the following description, the same drawing reference numerals are used for the same elements even in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, well-known functions or constructions are not described in detail since they would obscure the exemplary embodiments with unnecessary detail.

Figure 2:
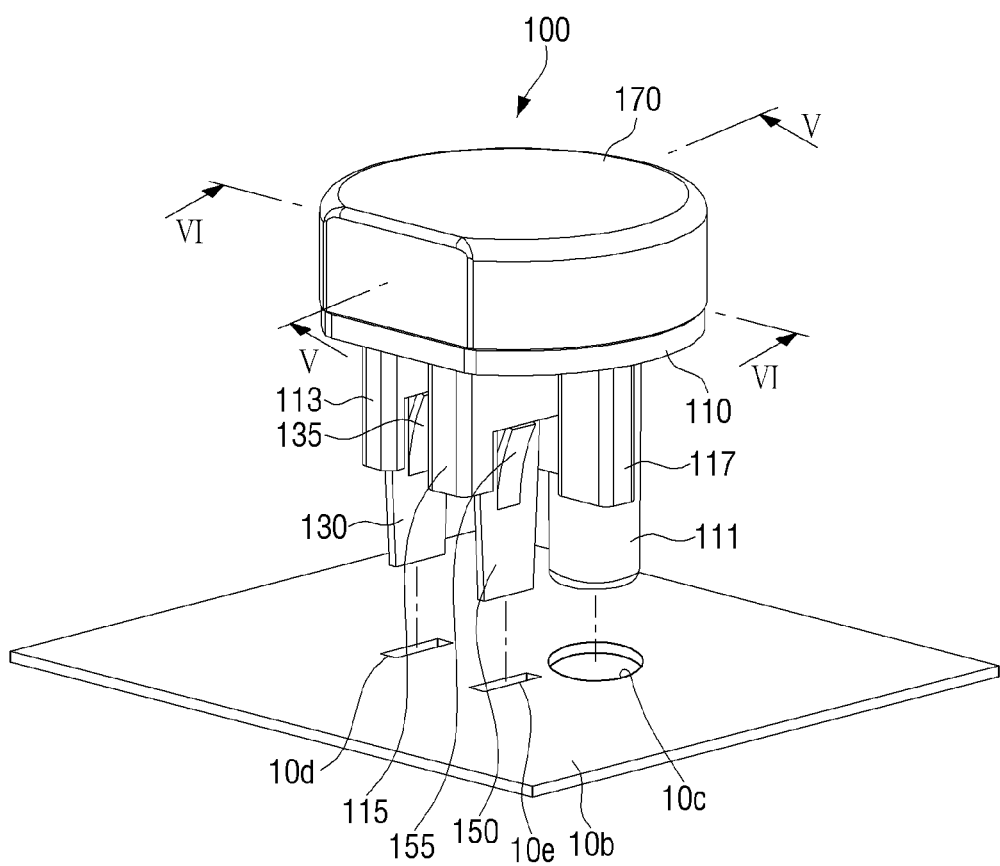
FIG. 2 is a perspective view illustrating a pressure switch for a dust sensor, according to an exemplary embodiment of the present general inventive concept.
Figure 7:
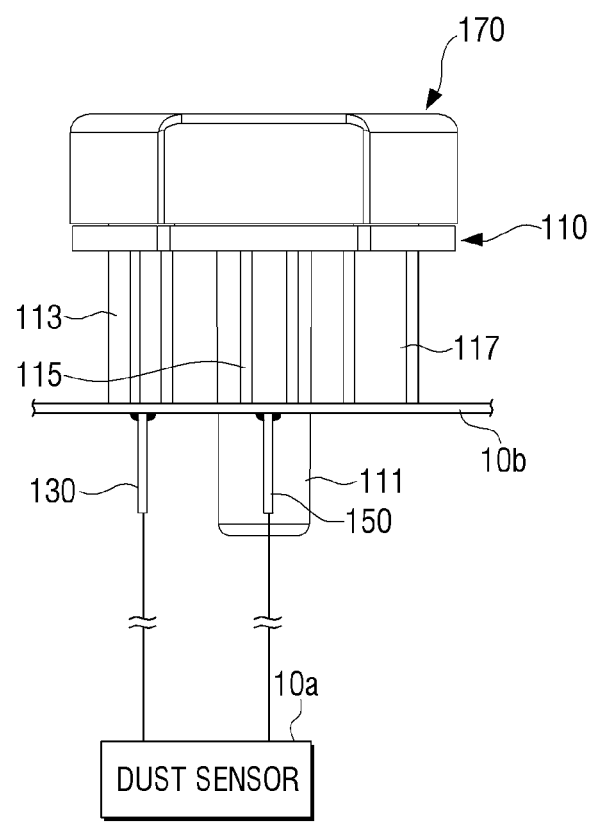
FIG. 7 is an enlarged view illustrating part VII of FIG. 6.

A structure of a pressure switch 100 (e.g., as shown in FIG. 2) for a dust sensor 10a (e.g., as shown in FIG. 7) according to an exemplary embodiment of the present general inventive concept will now be described in detail.

Referring to FIG. 1, a pressure switch 100 (e.g., as shown in FIG. 2) is included in a vacuum cleaner 1 to turn on a dust sensor 10a (e.g., as shown in FIG. 7) only when sucking dust by using a suction pressure generated by a suction motor (not shown) of a cleaner body 3, and turn off the dust sensor 10a when releasing the suction pressure. The pressure switch 100 is included in the dust sensor 10a. In this case, the dust sensor 10a may be mounted on a printed circuit board (PCB) 10b (e.g., as shown in FIG. 2) to be electrically connected to first and second terminals 130 and 150 (e.g., as shown in FIG. 2) that will be described later.

A dust sensing unit 10 is disposed between an extension tube 11 and a suction nozzle 13 of the vacuum cleaner 1. In other words, an end of the dust sensing unit 10 is combined with a lower end of the extension tube 11, and an other end of the dust sensing unit 10 is combined with the suction nozzle 13. The dust sensing unit 10 is disposed between the extension tube 11 and the suction nozzle 13 in the present exemplary embodiment but is not limited thereto. Therefore, for example, the dust sensing unit 10 may be connected between the extension tube 11 and a handle 15. Further, in other embodiments, the extension tube 11, the suction nozzle 13, and the handle 15 may be formed into a single body.

FIG. 1 depicts an extension hose 17 that connects the cleaner body 3 to the handle 15.

Figure 3:
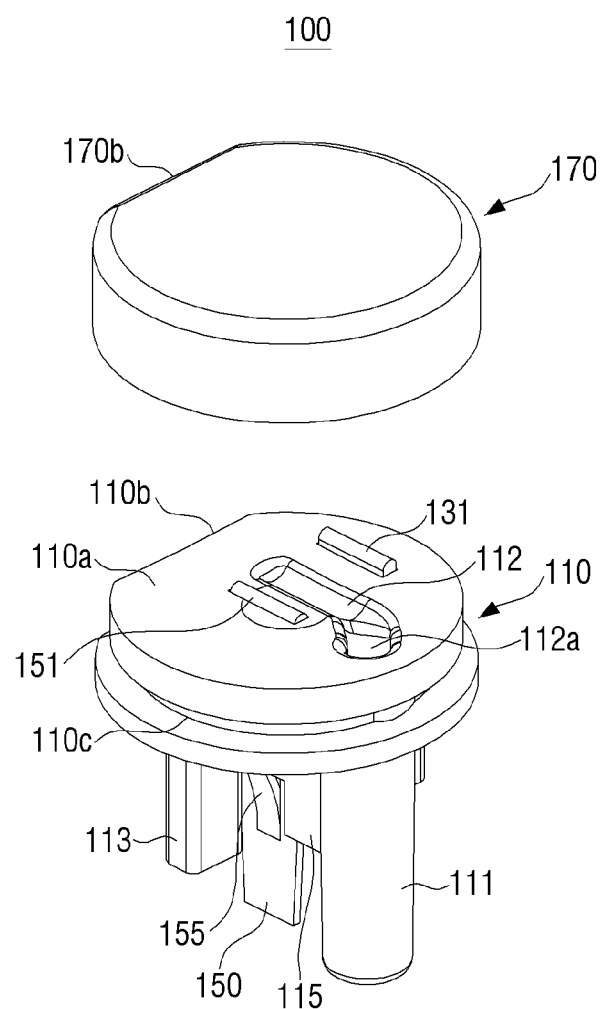
FIG. 3 is an exploded perspective view illustrating a pressure switch for a dust sensor, according to an exemplary embodiment of the present general inventive concept.

Referring to FIGS. 2 and 3, the pressure switch 100 includes a body part 110, the first terminal 130 and the second terminal 150, and a flexible cap 170.

A flow path groove 112 having a preset length is formed in an upper surface 110a of the body part 110.

Figure 5:
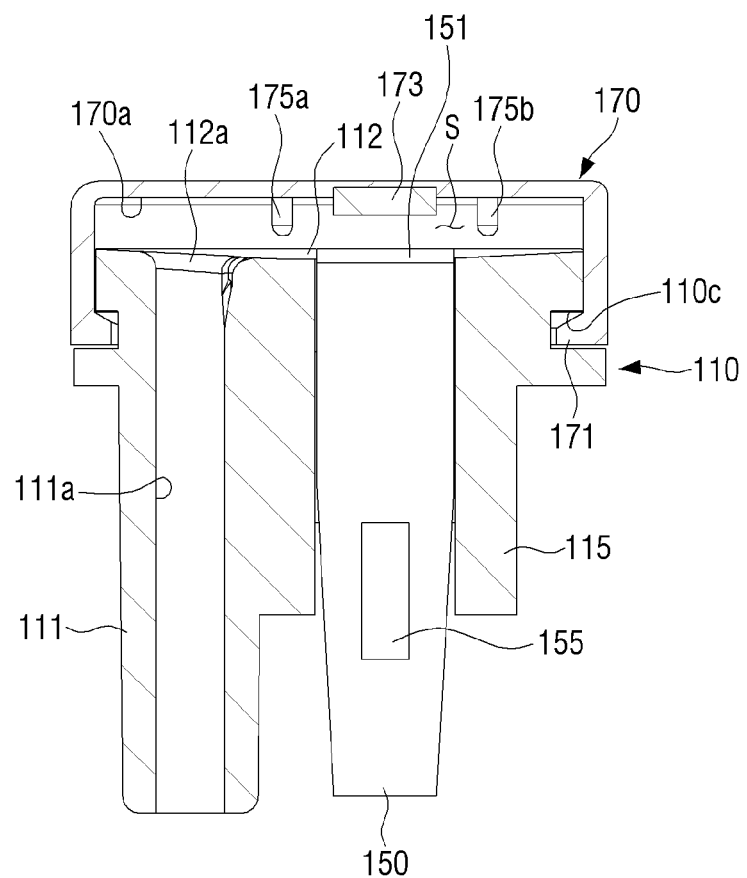
FIG. 5 is a cross-sectional view taken along line V-V of FIG. 2.
Figure 6:
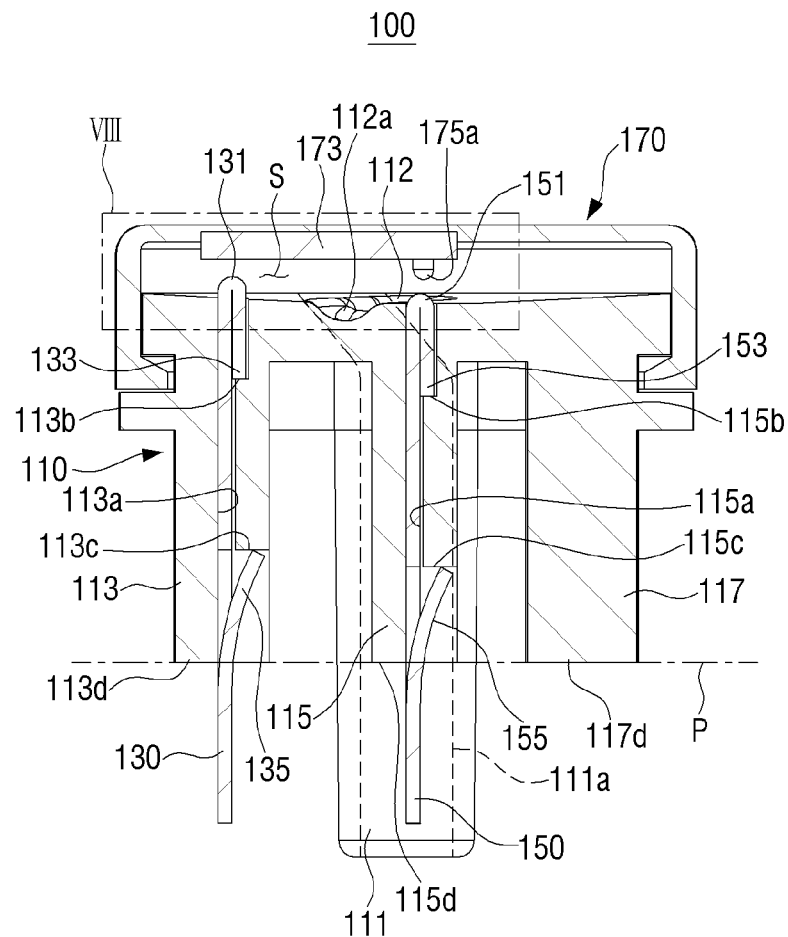
FIG. 6 is a cross-sectional view taken along line VI-VI of FIG. 2.

The flow path groove 112 is formed between the first terminal 130 and the second terminal 150 that protrude from the upper surface 110a of the body part 110 to preset heights, and is connected to a connection tube 111. The flow path groove 112 may secure a reliability of an operation of a conductive member 173 of FIG. 8 that is connected to the first terminal 130 and the second terminal 150 due to a deformation of the flexible cap 170, wherein the conductive member 173 will be described later. In other words, as a negative pressure is formed in a space S (e.g., as shown in FIG. 5 and FIG. 6) between the upper surface 110a of the body part 110 and the flexible cap 170, an internal surface 170a of the flexible cap 170 of FIG. 8 may be deformed. As a result, the deformed internal surface 170a of the flexible cap 170 of FIG. 8 may abut against the upper surface 110a of the body part 110. In this case, a part 112a of the flow path groove 112 that is connected to the connection tube 111 may be blocked by the internal surface 170a of the flexible cap 170 before the conductive member 173 (of FIG. 8) can be connected to the first terminal 130 and the second terminal 150. Therefore, a connection operation between the conductive member 173 and the first terminal 130 and the second terminal 150 may not be appropriately performed. However, this error may be prevented.

Also, as part of a prevention of closing of the flow path groove 112, the upper surface 110a of the body part 110 may be formed to have a gentle curvature so as to be gradually lowered from an outer side of the body part 110 to a center of the body part 110.

A combination groove 110c is formed along a circumference of the body part 110 so as to enable a combination projection 171 of the flexible cap 170 as shown in FIG. 5 to be engagingly snapped into the combination groove 110c. In this case, a linear part 110b is formed at a side of the body part 110 to set the conductive member 173, which is disposed inside the flexible cap 170, in a position corresponding to the first terminal 130 and the second terminal 150 when the flexible cap 170 engages with the body part 110. Here, as the flexible cap 170 is formed in a shape corresponding to an upper part of the body part 110. Thus, a worker may avoid potential placement guesses of the conductive member 173 when assembling the flexible cap 170 to the body part 110.

Figure 4:
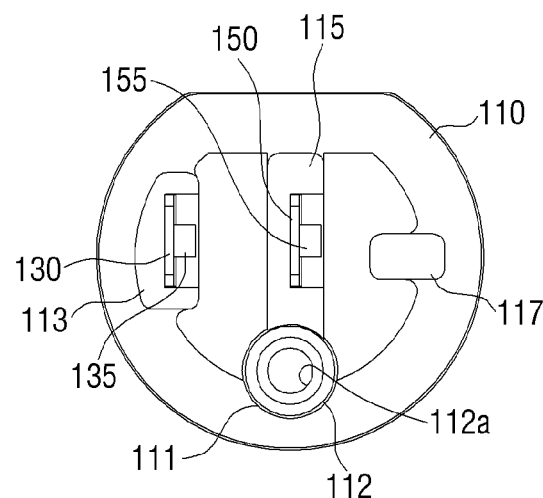
FIG. 4 is a bottom view illustrating a pressure switch for a dust sensor, according to an exemplary embodiment of the present general inventive concept.

Referring to FIG. 4, the connection tube 111, the first terminal 130 and the second terminal 150, and a support part 117 are shown as spaced apart at a lower part of the body part 110. Alternatively, the connection tube 111 and the second terminal 150 may be formed to be connected to each other.

Referring to FIG. 5, an air path 111a is formed along an interior of the connection tube 111. A lower end of the connection tube 111 penetrates through a through-hole 10c (of FIG. 2) formed in the PCB 10b (of FIG. 2). In this case, a lower end of an air path 111a is connected to a suction flow path (not shown) formed in the extension tube 11. Also, an upper end of the air path 111a is connected to the connection part 112a of the flow path groove 112.

Referring to FIG. 6, an insertion groove 113a is formed along an interior of a first extension part 113, and the first terminal 130 is inserted into the insertion groove 113a. Also, first and second hooking projections 113b and 113c are respectively formed at upper and lower parts of the insertion groove 113a to firmly fix the first terminal 130. A lower end of a folding part of the first terminal 130 is fixed to or abuts against the first hooking projection 113b, and a projection 135 is similarly fixed to or abuts against the second hooking projection 113c. As described above, the first terminal 130 may be fixed by, engage, or abut against the first and second hooking projections 113b and 113c so as not to be moveable in any one of upper and lower directions.

A second extension part 115 has a similar structure to the first extension part 113. In other words, an insertion groove 115a is formed along an interior of the second extension part 115, and the second terminal 150 may be inserted into the insertion groove 115a. Also, third and fourth hooking projections 115b and 115c are formed at upper and lower parts of the insertion groove 115a to firmly fix the second terminal 150. In this case, an end 153 of a folding part of the second terminal 150 is fixed to or abuts against the third hooking projection 115b, and a projection 155 is similarly fixed to or abuts against the fourth hooking projection 115c.

The support part 117 supports the body part 110 along with the first and second extension parts 113 and 115 at a third point on the PCB 10b to stably place the body part 110 and the first and second extension parts 113 and 115 on the PCB 10b. In this case, a lower end of the support part 117 is positioned on the same line P as lower ends of the first and second extension parts 113 and 115. Therefore, when the support part 117 is stably placed on the PCB 10b, the body part 110 does not incline toward one direction.

The first terminal 130 is inserted into the first extension part 113. In this case, as an upper part of the first terminal 130 is folded to a preset length, an uppermost end of the first terminal 130 is rounded to have a preset curvature so as not to be sharp. Therefore, when a negative pressure is formed in the space S, the flexible cap 170 abuts against the upper surface 110a of the body part 110 so as to enable the conductive member 173 to be strongly connected to a bending part 131 of the first terminal 130. Here, as the bending part 131 of the first terminal 130 is rounded, although the conductive member 173 is repeatedly connected to the bending part 131 of the first terminal 130, the conductive member 173 may not be damaged.

A lower end 133 of the folding part of the first terminal 130 engages the first hooking projection 113b of the first extension part 113. Also, the projection 135 protrudes from the lower part of the first terminal 130 and also engages the second hooking projection 113c of the first extension part 113. When the first terminal 130 is inserted into the insertion groove 113a of the first extension part 113, the lower part of the first terminal 130 is inserted into an upper part of the insertion groove 113a, and then the first terminal 130 is pushed down along the insertion groove 113a. Here, the projection 135 elastically protrudes when getting out of the insertion groove 113a to engage the second hooking projection 113c in a hooking or locking relationship. In this case, as the lower end 133 of the folding part of the first terminal 130 engages the first hooking projection 113b of the first extension part 113, the hooking projection 113b prevents the lower end 133 of the folding part of the first terminal 130 from any downward movement along the insertion groove 113a. In this way, the first terminal 130 is fixedly positioned within the insertion groove 113a.

If the first terminal 130 is to be removed from the insertion groove 113a, the projection 135 is pushed toward the first terminal 130 to release the projection 135 from the hooking relationship with the second hooking projection 113c. While the projection 135 is being pushed back, the flexible cap 170 and thus the first terminal 130 may be pulled away from the body part 110 in a reverse direction, thus separating the first terminal 130 from the insertion groove 113a.

Also, when the lower part of the first terminal 130 is inserted into a through-hole 10d (of FIG. 2) of the PCB 10b as shown in FIG. 7, the lower part of the first terminal 130 may protrude from the first extension part 113 to a preset length. In the embodiment as shown in FIG. 7, the protruded lower part of the first terminal 130 may be soldered to the PCB 10b.

The second terminal 150 has similar or the same structure as the first terminal 130 and is firmly positioned into the insertion groove 115a of the second extension part 115. Specifically, a lower end 153 (of FIG. 6) of a folding part of the second terminal 150 and a projection 155 of the second terminal 150 are respectively fixed to the third and fourth hooking projections 115b and 115c of the insertion groove 115a of the second extension part 115. Also, like the first terminal 130, a bending part 151 of the folding part forming an uppermost end of the second terminal 150 is rounded to have a preset curvature.

Like the first terminal 130, the second terminal 150 is inserted into a through-hole 10e of the PCB 10b to be soldered on the pad formed on the PCB 10b. In this case, the body part 110 is fixed onto the PCB 10b through a bond formed by soldering performed at the first terminal 130 and the second terminal 150.

Figure 8:
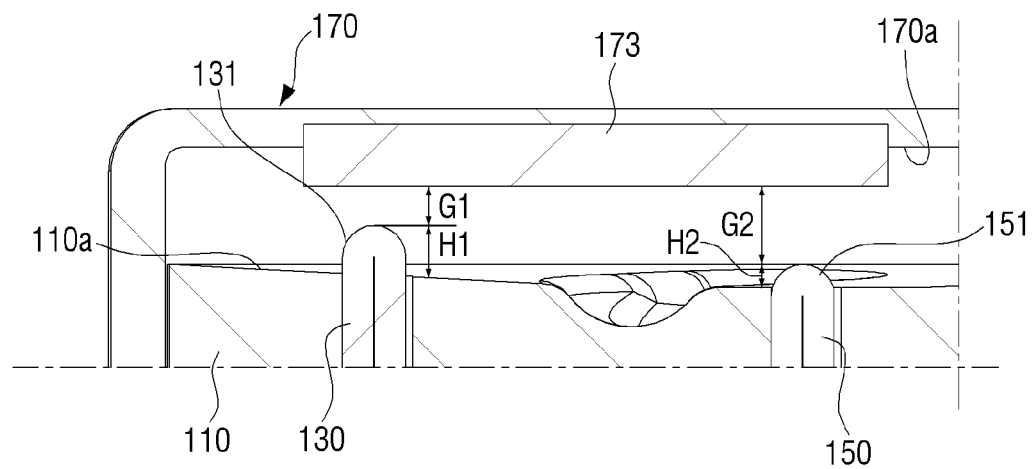
FIG. 8 is a side view illustrating first and second terminals that are soldered on a printed circuit board (PCB)

Referring to FIG. 8, the first terminal 130 is disposed approximately at a place where the first terminal 130 is eccentric from a center of the flexible cap 170, and the second terminal 150 is disposed approximately at a place corresponding to the center of the flexible cap 170. In addition, the bending parts 131 and 151 that are the uppermost ends of the first terminal 130 and the second terminal 150 respectively protrude from the upper surface 110a of the body part 110 to first and second heights H1 and H2. In this case, the first height H1 may be higher than the second height H2.

Arrangements and protrusion heights of the first terminal 130 and the second terminal 150 as described above are considered to smoothly maintain operations of the first terminal 130 and the second terminal 150 connected to the conductive member 173 when the negative pressure is formed in the space S. In other words, the second terminal 150 corresponds to an approximate center of the flexible cap 170 that is most greatly deformed and thus is formed to be lower than the first height H1 of the first terminal 130 that protrudes. The first terminal 130 is disposed at a surrounding side of the flexible cap 170 (in a position eccentric from the center of the flexible cap 170) that is smaller deformed than the center of the flexible cap 170. Therefore, the first terminal 130 is formed at the second height H2 higher than the first height H1 of the second terminal 150.

Also, the first terminal 130 and the second terminal 150 are set to respectively keep first and second gaps G1 and G2 from the conductive member 173. Here, the first gap G1 is narrower than the second gap G2. A difference between the first and second gaps G1 and G2 is inversely proportional to a difference between the first and second heights H1 and H2. In other words, as the first and second heights H1 and H2 become high, the first and second gaps G1 and G2 become narrow. This is because a lower surface of the conductive member 173 keeps an approximately similar gap from the upper surface 110a of the body part 110. Also, in the present exemplary embodiment, the upper surface 110a of the body part 110 is formed to become gradually concave from a periphery toward a center. However, the upper surface 110a of the body part 110 is not limited thereto and may be formed as a flat surface. In this case, a gap between the upper surface 110a of the body part 110 and the lower surface of the conductive member 173 may be equally maintained.

The flexible cap 170 may be formed of a material having an elasticity, e.g., a silicon material having a thin thickness (e.g., between about 0.5 mm and about 0.8 mm). In this case, a thickness of the flexible cap 170 may be formed in consideration of a whole size of the flexible cap 170 and a gap between the upper surface 110a of the body part 110 and the conductive member 173.

Also, a deformation amount of the flexible cap 170 may be considered in addition to the above-described conditions that are considered when setting the thickness of the flexible cap 170. In other words, a vacuum degree of the space S between the upper surface 110a of the body part 110 and the flexible cap 170 is proportional to a level of a voltage applied to the pressure switch 100, and the deformation amount of the flexible cap 170 is proportional to the vacuum degree of the space S. Therefore, the thickness of the flexible cap 170 may be set in consideration of the voltage applied to the pressure switch 100 and the deformation amount of the flexible cap 170.

The conductive member 173 is disposed on the internal surface 170a of the flexible cap 170. In this case, although the flexible cap 170 is frequently deformed, the conductive member 173 may be inserted into or embedded in the flexible cap 170.

The conductive member 173 may be formed to have a similar thickness to the thickness of the flexible cap 170. Also, as shown in FIG. 8, the conductive member 173 may be fixed to the flexible cap 170 so as to enable a lower surface thereof to protrude more than the internal surface 170a of the flexible cap 170. However, the conductive member 173 is not limited thereto and thus may be positioned on the same plane as the internal surface 170a of the flexible cap 170.

Figure 9A:
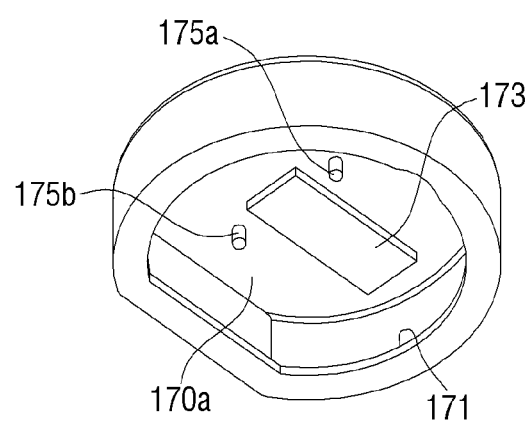
FIG. 9A is a perspective view illustrating an inside of a flexible cap according to an exemplary embodiment of the present general inventive concept.

Referring to FIG. 9A, a pair of separation projections 175a and 175b are formed into a single body on the internal surface 170a of the flexible cap 170 to prevent the conductive member 173 from being connected to the first terminal 130 and the second terminal 150, so as to keep the dust sensor 10a turned off when the negative pressure is not formed in the space S. The separation projections 175a and 175b may be disposed adjacent to the conductive member 173.

Also, lengths of the separation projections 175a and 175b protruding from the internal surface 170a of the flexible cap 170 may be thicker than a thickness of the conductive member 173 measured from the internal surface 170a of the flexible cap 170.

At least one of the separation projections 175a and 175b may function as separation projections.

Figure 9B:
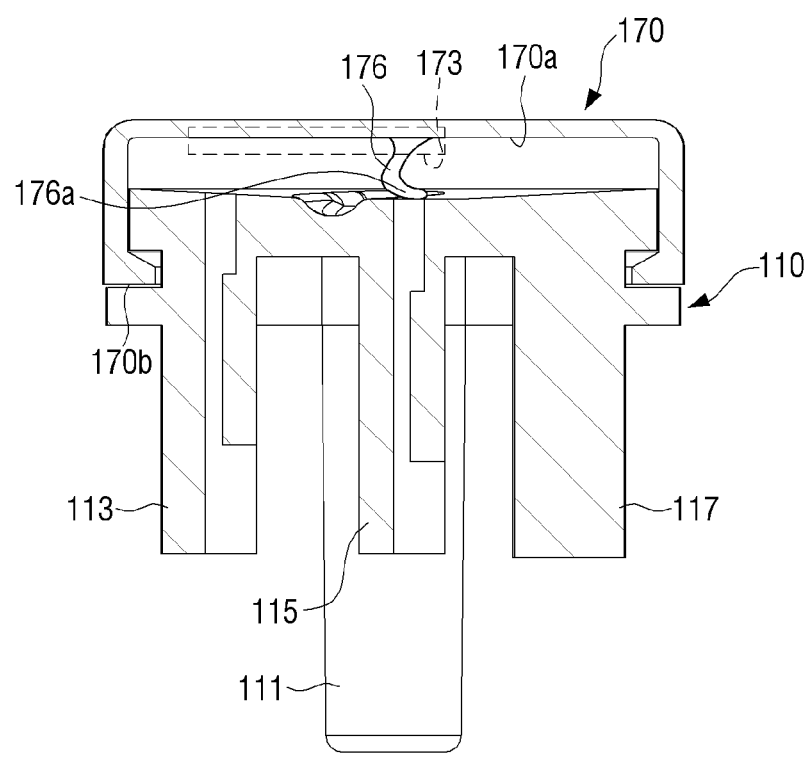
FIG. 9B is a cross-sectional view illustrating a flexible cap according to another exemplary embodiment of the present general inventive concept.

Referring to FIG. 9B, a separation projection 176 may be formed to protrude from the internal surface 170a of the flexible cap 170 more than an outer lower end 170b of the flexible cap 170. In this case, if the flexible cap 170 engages the body part 110, the separation projection 176 is bent so as to enable a lower end 176a to elastically rest or is elastically supported on the upper surface 110a of the body part 110. The separation projection 176 may be formed to an appropriate thickness so as to prevent the elasticity of the separation projection 176 from interfering with a connection of the conductive member 173 to the first terminal 130 and the second terminal 150. In such embodiments, the connection of the conductive member 173 is made through a deformation of the flexible cap 170 caused by the negative pressure formed in the space S.

FIG. 9B illustrates the pressure switch 100 from which the first terminal 130 and the second terminal 150 are omitted for convenience of description.

An operation of the pressure switch 100 having the above-described structure according to the present exemplary embodiment will now be described with reference to FIGS. 6 through 10.

In order to do cleaning, the suction motor (not shown) of the cleaner body 3 of FIG. 1 is turned on or activated to suck or draw dust and/or other objects through a suction flow path (e.g., a flow path forms when the suction nozzle 13, the extension tube 11, the handle 15, the extension hose 17, and an internal part of the cleaner body 3 are connected).

Here, the space S that is connected to the extension tube 11 through the connection tube 111 of the body part 110 is released from an air pressure and then forms a negative pressure.

Figure 10:
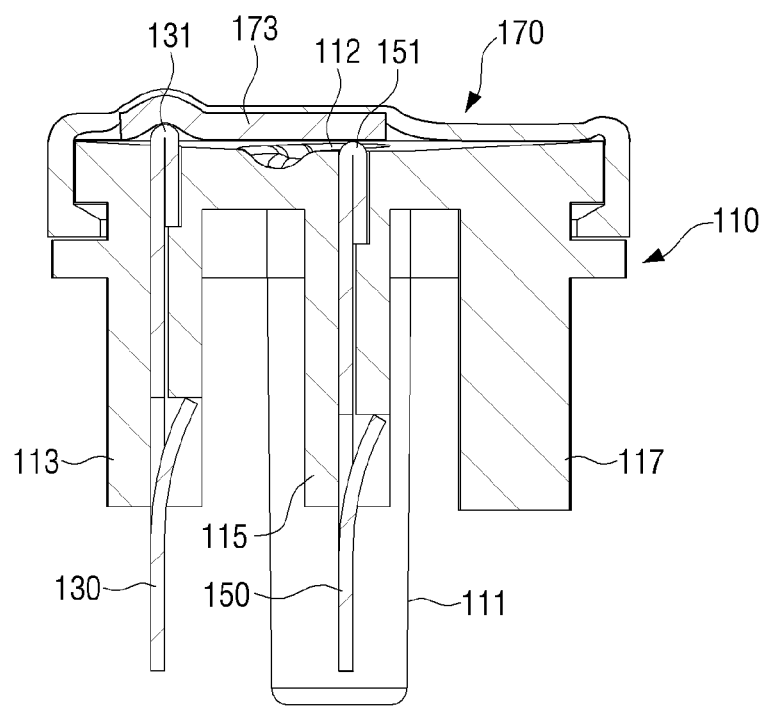
FIG. 10 is a cross-sectional view illustrating an electrified state of a pressure switch for a dust sensor, according to an exemplary embodiment of the present general inventive concept.

In this case, the flexible cap 170 that is not deformed as shown in FIG. 6 is connected to the upper surface 110a of the body part 110 to be deformed as shown in FIG. 10. Here, the conductive member 173 is deformed toward a direction wherein the conductive member 173 abutts against the flexible cap 170, and the first terminal 130 and the second terminal 150, so as to be connected to the first terminal 130 and the second terminal 150.

As the first terminal 130 and the second terminal 150 are electrically connected to each other through the conductive member 173, the dust sensor 10a is activated to sense dust passing through the extension tube 11. When dust is sensed by the dust sensor 10a, the dust sensing unit 10 emits light in a uniform color through a lamp 10g. For example, the lamp 10g may emit red light when dust is sensed by the dust sensor 10a and emit green light when dust is not sensed.

If the suction motor is turned off, the suction path is changed into an air pressure state, and the space S of the pressure switch 100 is also changed into an air pressure state. Here, the flexible cap 170 bounces back or returns to its original shape from its deformed shape based on its elasticity. In this case, the conductive member 173 is thus released from the first terminal 130 and the second terminal 150 through the separation projections 175a and 175b.

Therefore, when the conductive member 173 is released from the first terminal 130 and the second terminal 150, the conductive member 173 is electrically disconnected from the first terminal 130 and the second terminal 150. As such, the dust sensor 10a enters an off state.

As described above, in the pressure switch 100 according to the present exemplary embodiment, only when a negative pressure is formed in the space S that the conductive member 173 is electrically connected to the first terminal 130 and the second terminal 150. Conversely, when the negative pressure is absent in the space S, the conductive member 173 is electrically disconnected from the first terminal 130 and the second terminal 150. Therefore, reliability of connection and disconnection functions between the conductive member 173 and the first terminal 130 and the second terminal 150 may be secured. The disconnection function may be performed smoothly by the elastic power of the flexible cap 170, and the connection function may be performed smoothly as the negative pressure is set to be greater than the elastic power of the flexible cap 170.

Figure 11A:
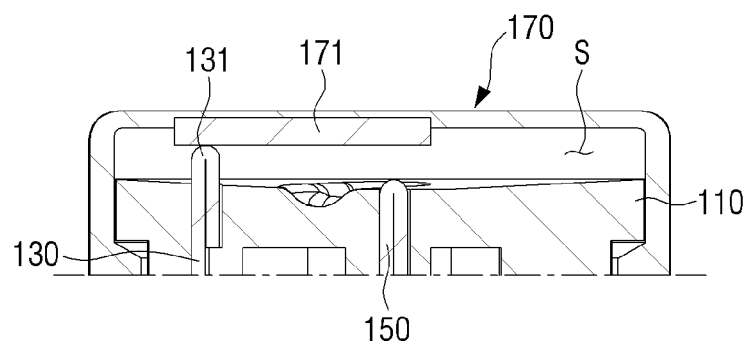
FIG. 11A is a cross-sectional view illustrating the first terminal of FIG. 6 that is set to be connected to a conductive member at all times.

Referring to FIG. 11A, in the pressure switch 100 according to the present exemplary embodiment, the first terminal 130 may be disposed to be connected to the conductive member 173. In this case, the first terminal 130 may be disposed to be connected to the conductive member 173 at all times. When the space S is in the air pressure state, the conductive member 173 is separated from the second terminal 150, and is thus electrically disconnected from the first terminal 130 and the second terminal 150.

Figure 11B:
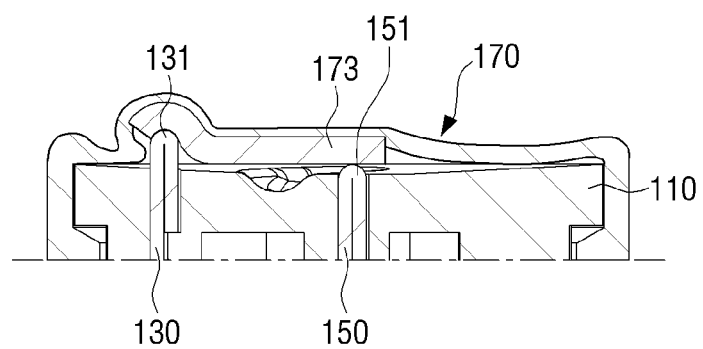
FIG. 11B is a cross-sectional view illustrating an electrified state of the pressure switch for the dust sensor shown in FIG. 11A.

However, as shown in FIG. 11B, when the negative pressure is formed in the space S, the conductive member 173 is deformed to abutt against the upper surface 110a of the body part 110 along with the flexible cap 170 so as to electrically connect the conductive member 173 with the second terminal 150.

A structure of a second pressure switch 1200 for a dust sensor according to another exemplary embodiment of the present general inventive concept will now be described with reference to FIGS. 12A and 12B. However, descriptions of the same elements of the pressure switch 1200 as those of the pressure switch 100 of the previous exemplary embodiment are omitted.

The pressure switch 1200 according to the present exemplary embodiment has a similar structure to that shown in FIG. 11A. However, a shape of a first terminal 230 and a structure of a flexible cap 270 are different from the shape of the first terminal 130 and the structure of the flexible cap 170 of the previous exemplary embodiment. In the pressure switch 1200 according to the present exemplary embodiment, the first terminal 230 includes a conductive member (detailed hereinafter) that can be electrically connected to a second terminal 250.

For this, as in the previous exemplary embodiment, the first terminal 230 is fixed into an insertion groove 213a of a first extension part 213. However, a connection part 231 is approximately horizontally bent at an upper part of the first terminal 230 to be disposed at a preset distance from a bending part 251 of the second terminal 250.

Also, the second terminal 250 may be inserted into an insertion groove 215a of a second extension part 215 and may protrude from an upper surface 210a of a body part 210 more than the second terminal 150 of the previous exemplary embodiment. This is to enable the first terminal 230 to be stably connected to the second terminal 250 when a negative pressure is formed in a space S'.

Differently from the previous exemplary embodiment, the flexible cap 270 does not include a conductive member on an internal surface 270a. If the negative pressure is formed in the space S', the flexible cap 270 is deformed and thus abuts against an upper surface 210a of the body part 210 as shown in FIG. 12B. Here, the connection part 231 of the first terminal 230 is pushed toward the second terminal 250 by the deformation of the flexible cap 270, thus resulting in electrically connecting the first terminal 230 to a bending part 251 of the second terminal 250. Therefore, as the first and second terminals 230 and 250 are electrically connected, the dust sensor 10a is turned on.

Also, if the negative pressure is released from the space S', and thus the space S' is changed into an air pressure state, the flexible cap 270 returns to an original shape thereof, and a pressure applied to the connection part 231 of the first terminal 230 is released by the flexible cap 270. Therefore, the connection part 231 of the first terminal 230 returns to an original position thereof due to an elasticity thereof. Therefore, the first and second terminals 230 and 250 are disconnected, and thus a dust sensor (e.g., the dust sensor 10a of FIG. 7) is deactivated or turned off.

A projection 271 may be formed on an internal surface 270a of the flexible cap 270 to face the connection part 231 of the first terminal 230. The projection 271 may pressurize the connection part 231 of the first terminal 230 through a deformed flexible cap 270 when the negative pressure is formed in the space S'.

Figure 12A:
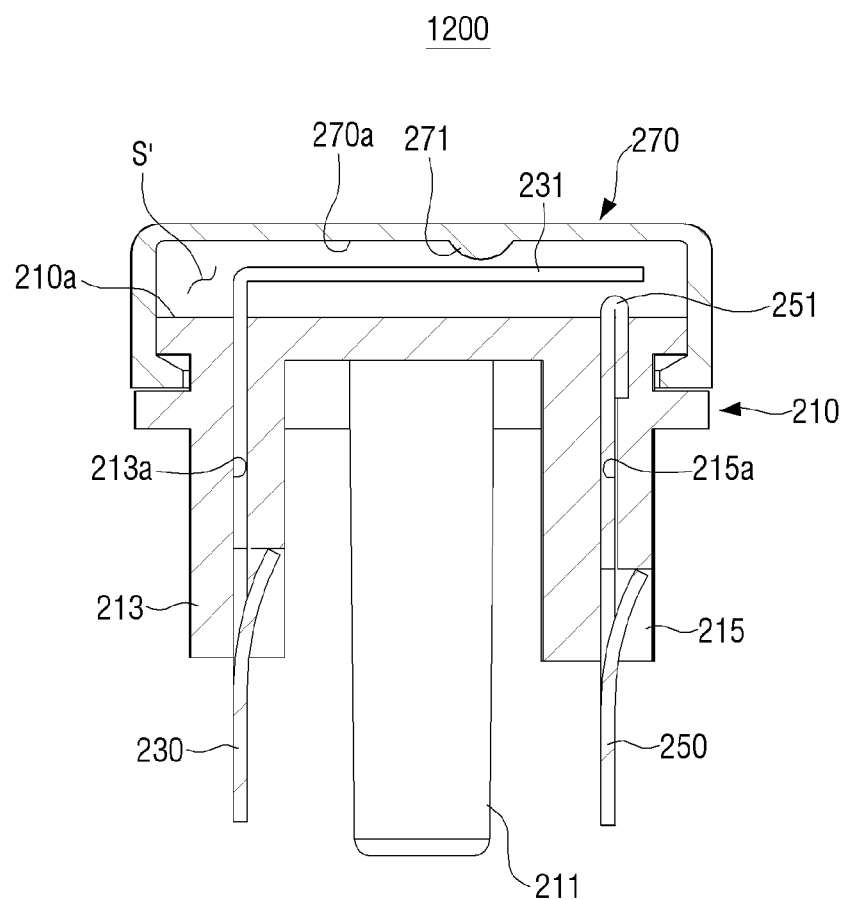
FIG. 12A is a cross-sectional view illustrating a pressure switch for a dust sensor, according to another exemplary embodiment of the present general inventive concept.
Figure 12B:
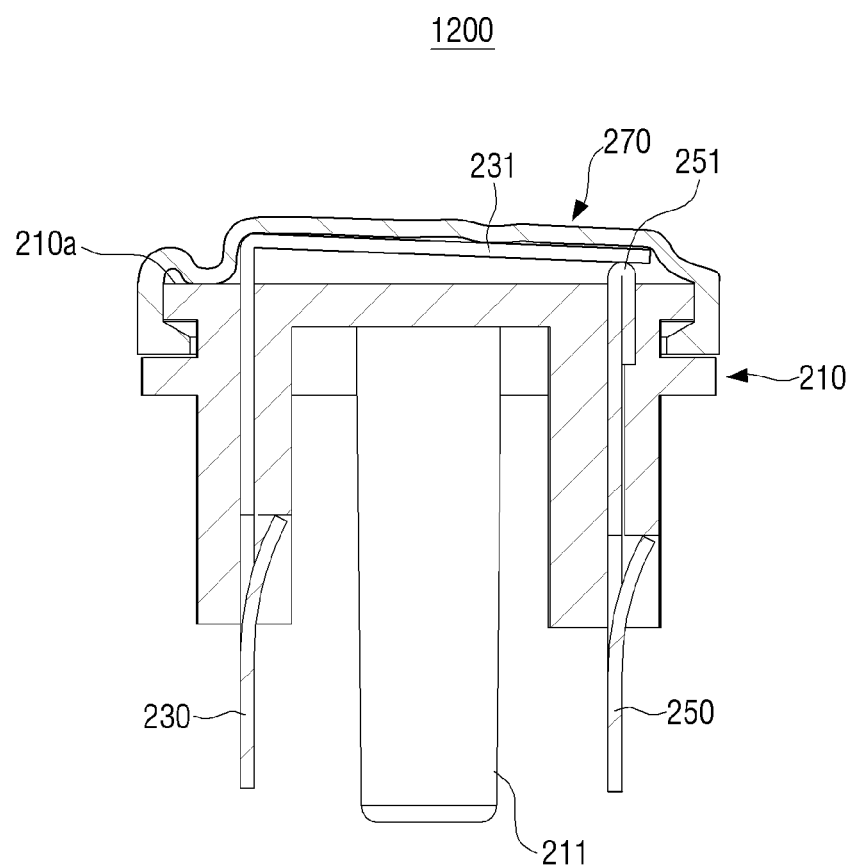
FIG. 12B is a cross-sectional view illustrating an electrified state of the pressure switch for the dust sensor.

As in the previous exemplary embodiment, in the present exemplary embodiment, a support part is provided at a lower part of the body part 210 but is omitted in FIGS. 12A and 12B. FIG. 12A also shows a connection tube 211 that connects the extension tube 11 and the space S'.

A structure of a third pressure switch 300 for a dust sensor according to another exemplary embodiment of the present general inventive concept will now be described with reference to FIGS. 13A and 13B.

Figure 13A:
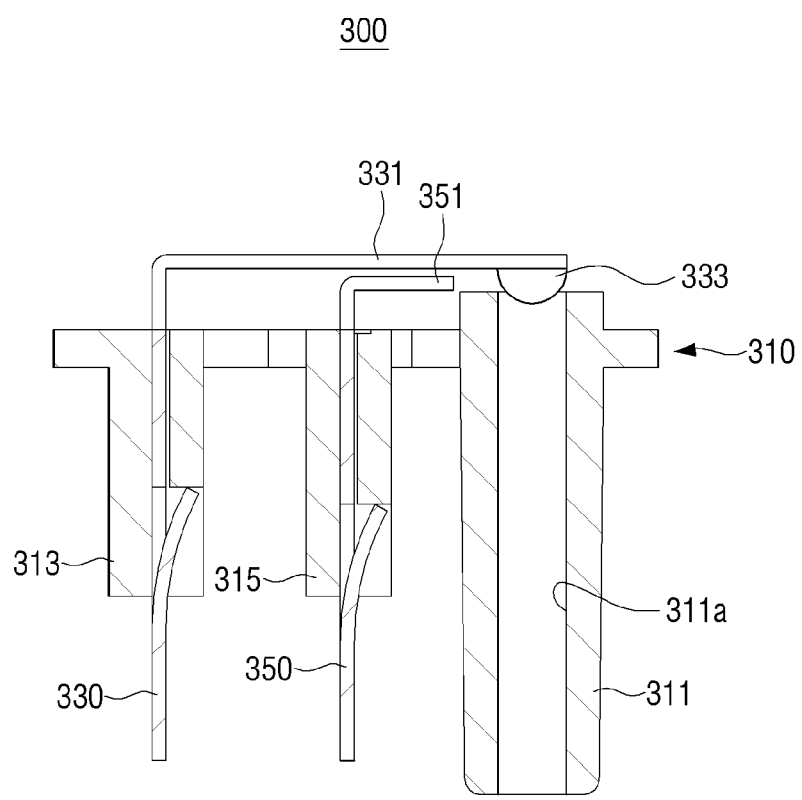
FIG. 13A is a cross-sectional view illustrating a pressure switch for a dust sensor, according to another exemplary embodiment of the present general inventive concept.

Referring to FIG. 13A, the third pressure switch 300 according to the present exemplary embodiment includes first and second terminals 330 and 350 that respectively include a connection part 331 in an original state, and a connection part 351, both of which are similar to the first terminal 230 of FIGS. 12A and 12B.

The connection part 331 of the first terminal 330 is disposed at a preset distance from the connection part 351 of the second terminal 350, and is directly connected to and disconnected from the connection part 351 of the second terminal 350 to turn on or activate, and/or turn off or deactivate a dust sensor (e.g., the dust sensor 10a of FIG. 7).

The connection part 331 of the first terminal 330 also includes an opening and closing member 333. The opening and closing member 333 is disposed to be adjacent to a connection tube 311. Specifically, the opening and closing member 333 may be disposed above the connection tube 311, such that a gap between a lower part of the opening and closing member 333 and an upper part of the connection tube 311 may be kept, as shown in FIG. 13A.

Figure 13B:
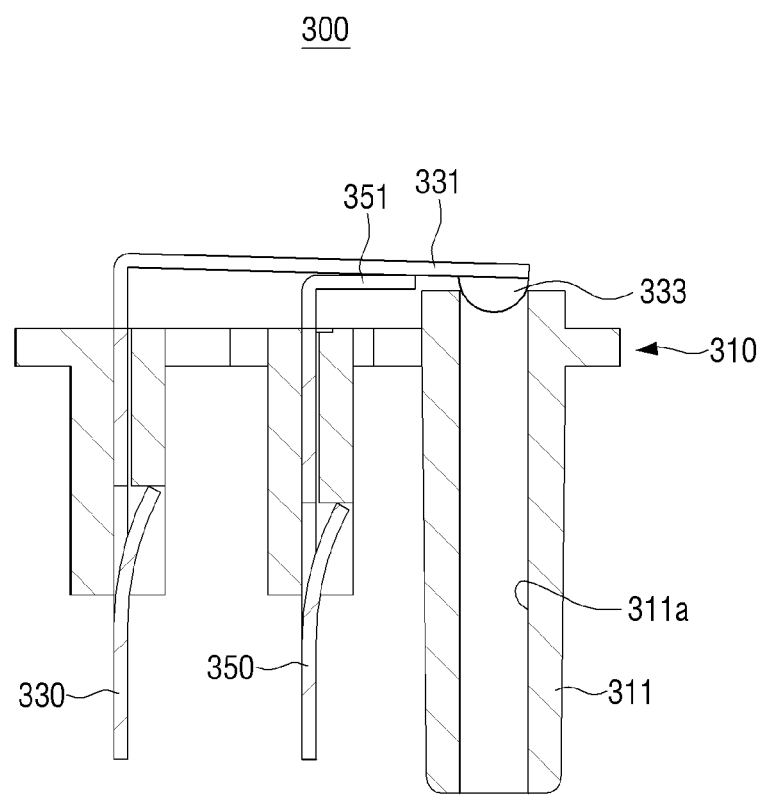
FIG. 13B is a cross-sectional view illustrating an electrified state of the pressure switch for the dust sensor.

In this case, when a negative pressure is formed in an air path 311a of the connection tube 311, the gap at the upper part of the connection tube 311 is closed as shown in FIG. 13B.

If the negative pressure is released from the air path 311a of the connection tube 311 so as to enable the air path 311a to be changed into an air pressure state, the opening and closing member 333 returns to the original position based on, for example, an elasticity of the connection part 331 of the first terminal 330. In this way, the gap at the upper part of the air path 311a of the connection tube 311 is again open. In this case, as the opening and closing member 333 is separated from the upper part of the air path 311a of the connection tube 311, the connection part 331 of the first terminal 330 and the connection part 351 of the second terminal 350 are disconnected to release the first and second terminals 330 and 350 from being electrically connected to each other. As a result, the dust sensor (e.g., the dust sensor 10a of FIG. 7) is deactivated.

As in the exemplary embodiment of FIGS. 1 through 11B, in the present exemplary embodiment, a support part (e.g., the support part 117 of FIG. 2) is provided at a lower part of the body part 310 but is omitted in FIGS. 13A and 13B. Also, FIG. 13A depicts a first extension part 313, and a second extension part 315.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A pressure switch configured to be disposed on a path through which dust passes, to control a dust sensor according to whether a suction pressure is formed in the path, the pressure switch comprising:
    a body part having a connection tube connected to the path, and an upper surface;
    first and second terminals configured to be electrically connected to the dust sensor and comprise upper ends protruding from the upper surface of the body part; and
    a flexible cap configured to engage the body part, and define a space with the upper surface of the body part, wherein:
        the flexible cap is deformed in response to a negative pressure being formed in the space to electrically connect the first and second terminals, and
        a flow path groove is formed in the upper surface of the body part to be connected to the connection tube.

2. The pressure switch of claim 1, wherein the flexible cap comprises a conductive member that is disposed inside the flexible cap to be connectable with the first and second terminals.

3. The pressure switch of claim 2, wherein the flexible cap engages the body part along with the conductive member therein.

4. The pressure switch of claim 2, wherein a height of the first terminal that protrudes from the upper surface of the body part is different than a height of the second terminal that protrudes from the upper surface of the body part.

5. The pressure switch of claim 4, wherein a position of the second terminal is set to correspond to a position where a deformation amount of the flexible cap is the greatest.

6. The pressure switch of claim 4, wherein the first terminal is set in a position where the first terminal is eccentric from a center of the flexible cap, and the second terminal is set in a position corresponding to the center of the flexible cap.

7. The pressure switch of claim 4, wherein the first and second terminals are separated from the conductive member in response to the space being in an air pressure state.

8. The pressure switch of claim 7, wherein the first terminal is connected to the conductive member at all times, and the second terminal is connected to the conductive member in response to the space being in a negative pressure state.

9. The pressure switch of claim 2, wherein a separation projection protrudes from an internal surface of the flexible cap, and
wherein a length of the separation projection is greater than a thickness of the conductive member measured from the internal surface of the flexible cap.

10. The pressure switch of claim 9, wherein the separation projection is disposed adjacent to the conductive member.

11. The pressure switch of claim 9, wherein a lower end of the separation projection is elastically supported on the upper surface of the body part.

12. The pressure switch of claim 1, wherein the flexible cap is formed of an elastic body.

13. The pressure switch of claim 1, wherein the flow path groove is disposed between the first and second terminals.

14. The pressure switch of claim 1, wherein the body part comprises first and second extension parts that protrude from a lower part of the body part to support the first and second terminals, and
wherein the first and second terminals are respectively inserted into the first and second extension parts and comprise lower ends that protrude beyond the first and second extension parts.

15. The pressure switch of claim 14, wherein upper parts and lower parts of the first and second terminals are respectively fixed to first and second hooking projections that are respectively formed at the first and second extension parts.

16. The pressure switch of claim 14, wherein the body part further comprises a support part that protrudes from a lower part thereof, and
wherein lower ends of the first and second terminals and the support part are all positioned on a level.

17. The pressure switch of claim 1, wherein the first and second terminals are formed in plate shapes and are disposed at a distance from each other to be parallel with each other.

18. A pressure switch configured to be disposed on a path through which dust passes, to control a dust sensor according to whether a suction pressure is formed in the path, the pressure switch comprising:

a body part having a connection tube connected to the path and comprising an upper surface in which a flow groove is formed to be connected to the connection tube;
first and second terminals configured to be electrically connected to the dust sensor, and having respective ends protruding from the upper surface of the body part, the respective ends having different heights when measured from the upper surface; and
a flexible cap configured to engage the body part to define a space with the upper surface of the body part and comprising a conductive member therein to be electively connected to the first and second terminals,
wherein the conductive member is connected to the first and second terminals in response to the flexible cap being deformed when a negative pressure is formed in the space.

19. A vacuum cleaner comprising:
a cleaner body configured to comprise a suction source;
a suction nozzle configured to suck dust;
an extension tube configured to connect the cleaner body to the suction nozzle; and
a pressure switch configured to be disposed at the extension tube to control a dust sensor according to whether a suction pressure is formed in the extension tube,
wherein the pressure switch comprises:
a body part having a connection part connected to the extension tube and an upper surface;
first and second terminals configured to be electrically connected to the dust sensor and comprising upper ends that protrude to different heights from the upper surface of the body part;
a flexible cap configured to engage the body part to define a space with the upper surface of the body part and comprising a conductive member therein to be connectable to the first and second terminals, and
wherein the flexible cap shrinks in response to a negative pressure being formed in the space, thereby connecting the conductive member to the first and second terminals.

* * * * *